(12) United States Patent
Dodds (10) Patent No.: US 9,632,198 B2
(45) Date of Patent: Apr. 25, 2017

(54) CALIBRATED ELECTROMAGNETIC SURVEY SYSTEM

(71) Applicant: GEOTECH AIRBORNE LIMITED, St. Michael (BB)

(72) Inventor: Jack Dodds, Aurora (CA)

(73) Assignee: GEOTECH AIRBORNE LIMITED, Lodge Hill (BB)

( * ) Notice: Subject to any disclaimer, the term of this patent is extended or adjusted under 35 U.S.C. 154(b) by 62 days.

(21) Appl. No.: 14/435,136

(22) PCT Filed: Oct. 12, 2012

(86) PCT No.: PCT/CA2012/050721
§ 371 (c)(1),
(2) Date: Apr. 10, 2015

(87) PCT Pub. No.: WO2014/056069
PCT Pub. Date: Apr. 17, 2014

(65) Prior Publication Data
US 2015/0268369 A1    Sep. 24, 2015

(51) Int. Cl.
| G01V 3/00 | (2006.01) |
| G01V 3/16 | (2006.01) |
| G01V 3/10 | (2006.01) |
| G01V 13/00 | (2006.01) |
| G01R 35/00 | (2006.01) |
| G01V 3/17 | (2006.01) |

(52) U.S. Cl.
CPC ............. G01V 3/10 (2013.01); G01R 35/005 (2013.01); G01V 13/00 (2013.01); G01V 3/16 (2013.01); G01V 3/17 (2013.01)

(58) Field of Classification Search
CPC ... G01V 3/17; G01V 3/12; G01V 3/16; G01V 3/107; G01V 3/10
USPC .................................................. 324/334, 330
See application file for complete search history.

(56) References Cited

U.S. PATENT DOCUMENTS

| 3,823,364 | A | 7/1974 | Cordelle et al. |
| 4,613,821 | A | 9/1986 | Sternberg et al. |
| 6,534,985 | B2 | 3/2003 | Holladay et al. |
| 8,400,157 | B2 * | 3/2013 | Kuzmin ................. G01V 3/165 324/331 |
| 2002/0043976 | A1 | 4/2002 | Holladay, III et al. |

FOREIGN PATENT DOCUMENTS

| CN | 102096113 A | 6/2011 |
| CN | 102159962 A | 8/2011 |
| CN | 102590869 A | 7/2012 |

(Continued)

OTHER PUBLICATIONS

Extended European Search Report; European Application No. 12886256.2; mailed Jun. 7, 2016.

(Continued)

*Primary Examiner* — Reena Aurora
(74) *Attorney, Agent, or Firm* — Polsinelli PC (57) ABSTRACT

An airborne electromagnetic survey system that determines a calibration factor for its receiver system by combining low frequency sensitivity for its magnetic induction sensors, with measurements of high frequency response obtained using calibration loops.

22 Claims, 5 Drawing Sheets

(56) References Cited

FOREIGN PATENT DOCUMENTS

WO      2011063510 A1    6/2011

OTHER PUBLICATIONS

Brian R. Spies et al: "Electromagnetic Methods in Applied Geophysics: vol. 2, Application, Parts A and B, chapter 5", Investigations in Geophysics; Jan. 1, 1991; pp. 353-363, XP055276132, Electromagnetic sounding.
Yusen Ley-Cooper et al: "Identification of calibration errors in a helicopter electromagnetic (JEM) data through transform to the altitude-corrected phase-amplitude domain", pp. G27-G34, 13 Figs. 10; Jan. 1, 2006, XP055276300.
International Search Report and Written Opinion for PCT Application No. PCT/CA2012/050721 dated Jul. 18, 2013.
Chinese Office Action; CN Application No. 201280077146.5; mailed Oct. 8, 2016.
English translation of Chinese Office Action; CN Application No. 201280077146.5; mailed Oct. 8, 2016.
English translation of CN102096113; Published Jun. 15, 2011.
English translation of CN102159962; Published Aug. 17, 2011.
English translation of CN102590869; Published Jul. 18, 2012.

\* cited by examiner

CALIBRATED ELECTROMAGNETIC SURVEY SYSTEM

CROSS-REFERENCE TO RELATED APPLICATION

This application is a national stage entry of PCT/CA2012/050721 filed Oct. 12, 2012, said application is expressly incorporated herein in its entirety.

BACKGROUND

Embodiments described herein relate to the field of geological mapping.

Active source electromagnetic (EM) surveying such as time domain electromagnetic (TDEM) surveying is a rapidly developing area of geophysical surveying. It encompasses ground based and airborne applications. TDEM geological mapping involves measuring the magnetic response of the earth to a primary magnetic field transmitted by the survey system. The relation between the transmitted primary field and the response is used to calculate the electrical resistivity structure of the earth, from which geological information is inferred.

Examples of TDEM surveying systems and methods are shown in U.S. Pat. No. 7,157,914 and WIPO patent applications PCT/CA2009/001197, PCT/CA2009/000217 and PCT/CA2010/001863.

Natural source electromagnetic surveying such as AFMAG surveying is another developing area of geophysical surveying, and is also used in ground and airborne applications. It involves measuring the magnetic response of the earth to naturally occurring electromagnetic fields. The transfer functions between various components of the magnetic field, some of which may be measured with a moving receiver and others at a fixed location, are used to calculate the electrical resistivity structure of the earth, from which geological information is inferred.

Examples of airborne AFMAG surveying systems and methods are shown in U.S. Pat. No. 6,876,202, U.S. patent application Ser. No. 12/910,386 published as US2011/0115489 A1, and U.S. patent application Ser. No. 12/645,915 published as US2010/0244843 A1.

In a practical EM survey system, the secondary response of the earth is sensed by one or more receivers (which may be mutually orthogonal) and is recorded by a data acquisition system. In an active source system, the effect of the primary magnetic field on the receiver may be reduced by the use of a bucking coil to allow for more accurate recording of the secondary field. Especially when a bucking coil is present, the transmitted primary magnetic field may also be sensed and recorded by a current sensor.

In the case of an active source system, the recorded transmitter current waveform and the secondary magnetic field waveforms are affected by the transmitted primary magnetic waveform, the bucking coil waveform, and the transfer functions of the receivers and recording system. While these effects tend to be small at long delay times (low frequencies) they become more important at short delay times (high frequencies). In the case of natural source systems, the amplitude and phase of the signals are affected by the receivers and recording system.

In order to properly interpret the recorded waveforms, it is desirable to reduce or remove the effects of the transmitted primary magnetic waveform, the receivers, and the recording system. This requires that the impulse response (or transfer function) of the sensors and recording system be precisely known. Since the impulse responses and transfer functions vary (for example, due to temperature changes) it is desirable to measure them at appropriate intervals, in field conditions.

The receivers in ground based natural source EM systems are typically ferromagnetic core magnetic induction sensors with a solenoid shape. Such receivers can conveniently be provided with a calibration winding in the form of a solenoid which encloses the main winding, extends slightly beyond the ends of the core, and is comparable in size to the sensor under calibration. This takes advantage of the fact that the magnetic field inside a solenoid winding can be accurately calculated knowing only the pitch of the winding and the current flowing in it.

The receivers in TDEM systems and airborne natural source EM are typically air coil magnetic induction sensors in the form of loops having multiple turns of wire. Such loops may be on the order of 1 m to 8 m in diameter, for example. Large air coil receivers have advantages including cleaner time domain response and a more convenient shape for airborne towing. In a field survey environment, it is difficult to provide a magnetic field of precisely known waveform and amplitude over a volume large enough to contain such a receiver.

SUMMARY

According to an example embodiment there is provided an electromagnetic receiver system for geophysical surveying. The electromagnetic receiver system includes an magnetic induction sensor for generating signals representative of changes in a sensed magnetic field; a waveform source for generating a test waveform having a first frequency range; a calibration loop positioned at least temporarily proximate to the magnetic induction sensor to generate a calibration response signal in the magnetic induction sensor upon application of the test waveform to the calibration loop; and a processing system. The processing system is configured to determine a calibration factor for application to signals from the magnetic induction sensor by determining the calibration factor in dependence on both the calibration response and a known sensitivity for the magnetic induction sensor for a second frequency range that is lower than the first frequency range.

According to an example embodiment there is provided a method for calibrating an electromagnetic receiver system for geophysical surveying, wherein the receiver system includes a magnetic induction sensor for generating signals representative of changes in a sensed magnetic field, a waveform source for generating a test waveform, and a calibration loop positioned at least temporarily proximate to the magnetic induction sensor. The method comprises: measuring a calibration response from the magnetic induction sensor to a test waveform having a first frequency range that is applied to the calibration loop by the waveform source; and determining a calibration factor for future application to survey signals from the magnetic induction sensor, the calibration factor being determined in dependence on both the calibration response and a known sensitivity for the magnetic induction sensor for a second frequency range that is lower than the first frequency range.

According to an example embodiment there is provided an electromagnetic receiver system for geophysical surveying including: a magnetic induction sensor having known low frequency sensitivity, a test current waveform generator, a calibration loop comparable in size to the sensor, and a processing system for combining measurements taken by the sensor when a test waveform is applied to the calibration loop with the known low frequency sensitivity of the sensor to obtain a transfer function and impulse response over the useful frequency range of the sensor.

According to an example embodiment there is provided a method for calibrating an electromagnetic receiver system for geophysical surveying including at least one induction magnetic sensor, to obtain a system transfer function in the frequency domain and a system impulse response in the time domain. The method includes: determining a low frequency response of the sensor by calculations based on dimensions of the sensor, generating a known current waveform having frequency components spanning a useful frequency range of the electromagnetic receiver system, passing the current waveform through at least one calibration loop that is comparable in size to the sensor and positioned to generate a magnetic field in the sensor, recording resulting signals generated by the sensor, analyzing the recorded signals to determine at multiple frequencies, the ratio of a sensor response at that frequency to the low frequency response, and combining the ratio with the known low frequency sensitivity of the sensor to obtain the system transfer function and system impulse response over the useful frequency range of the system.

DESCRIPTION OF EXAMPLE EMBODIMENTS

Example embodiments of a calibrated receiver system for an EM survey system for geological mapping will now be described. In various embodiments, the receiver system may be used in airborne or ground based survey systems as well as active source and natural source systems.

Figure 1:
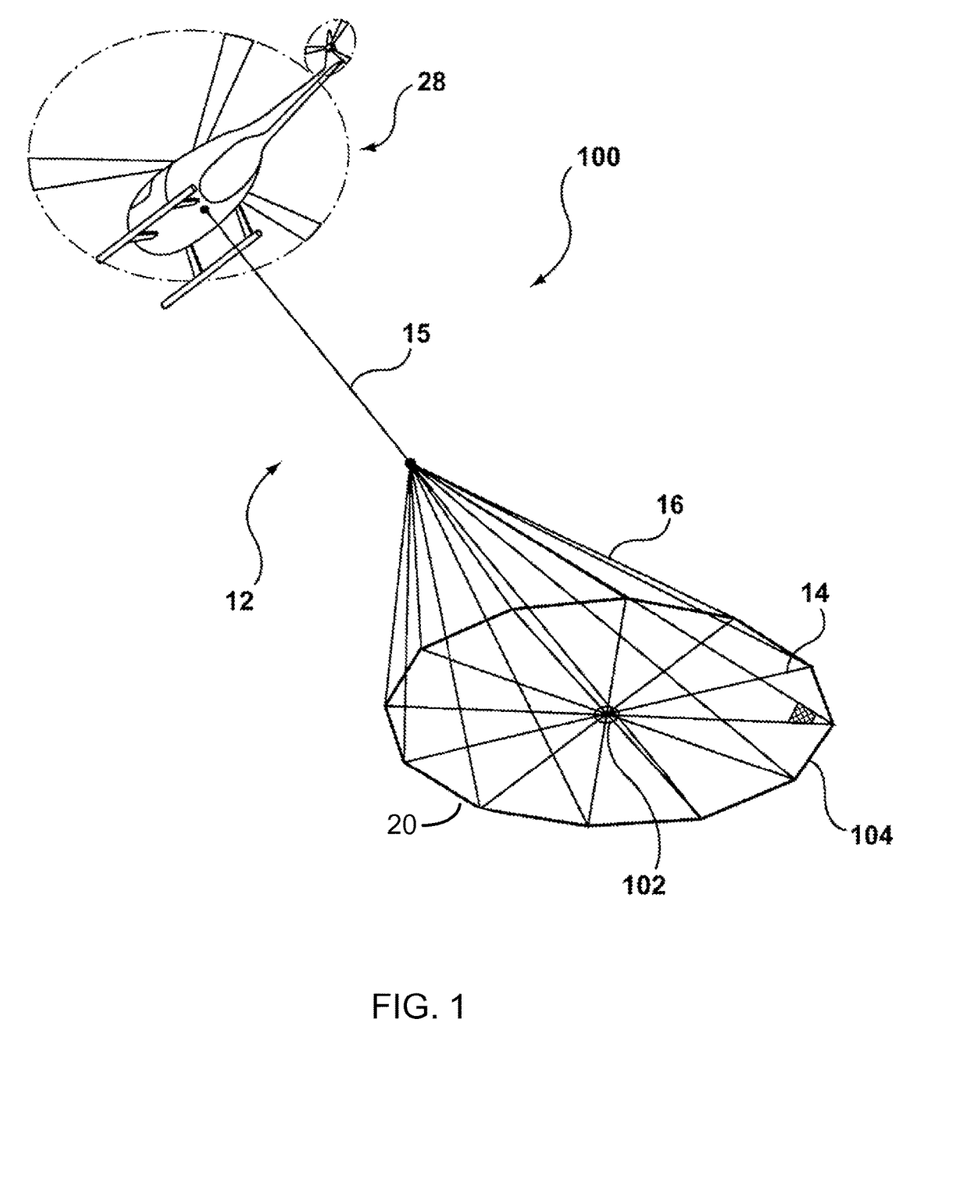
FIG. 1 is a diagram of an airborne time domain electromagnetic system.

For the purposes of explaining one example embodiment, FIG. 1 shows a schematic view of an active source airborne TDEM survey system 100 that can incorporate a calibrated receiver system. The TDEM survey system 100 includes a transmitter loop 104 and a sensor assembly 102. The TDEM survey system 100 can be carried by an aircraft 28 such as an airplane, helicopter, balloon or airship, for example. In at least some example embodiments, the transmitter loop 104 and receiver coil assembly 102 are part of a tow assembly 12 that is towed by the aircraft 28. In the example embodiment shown in FIG. 1, the sensor assembly 102 is located substantially at the center of the transmitter loop 104, with the transmitter loop 104 being supported by a frame 20 that is suspended from multiple support cables or ropes 16. Ropes 16 are each attached to a unique point on the circumference of the transmitter loop frame 20 at one end and to a common tow cable 15 at the other end. In one example embodiment the transmitter loop frame 20 is a simple polygonal frame that approximates a circle and is formed from a plurality of tubular segments that define a continuous internal passage in which the transmitter loop 104 extends. In some example embodiments, the ropes 16 include at least one suspension cable or rope that supports the sensor assembly 102. The sensor assembly 102 may in some example embodiments be centrally positioned by a series of radially extending cables or ropes 14 that extend to the transmitter loop frame 20. In one example embodiment, when in use the transmitter loop 104 is horizontally positioned with a substantially vertical dipole axis, and the sensor assembly 102 is located at a center of the transmitter coil 104.

The tow assembly configuration shown in FIG. 1 is merely one example of many possible physical configurations that the TDEM survey system 100 can have—for example, in some embodiments the sensor assembly 102 can be physically supported by the tow assembly above or below the transmitter loop 104 or towed behind the transmitter loop 104.

Figure 2:
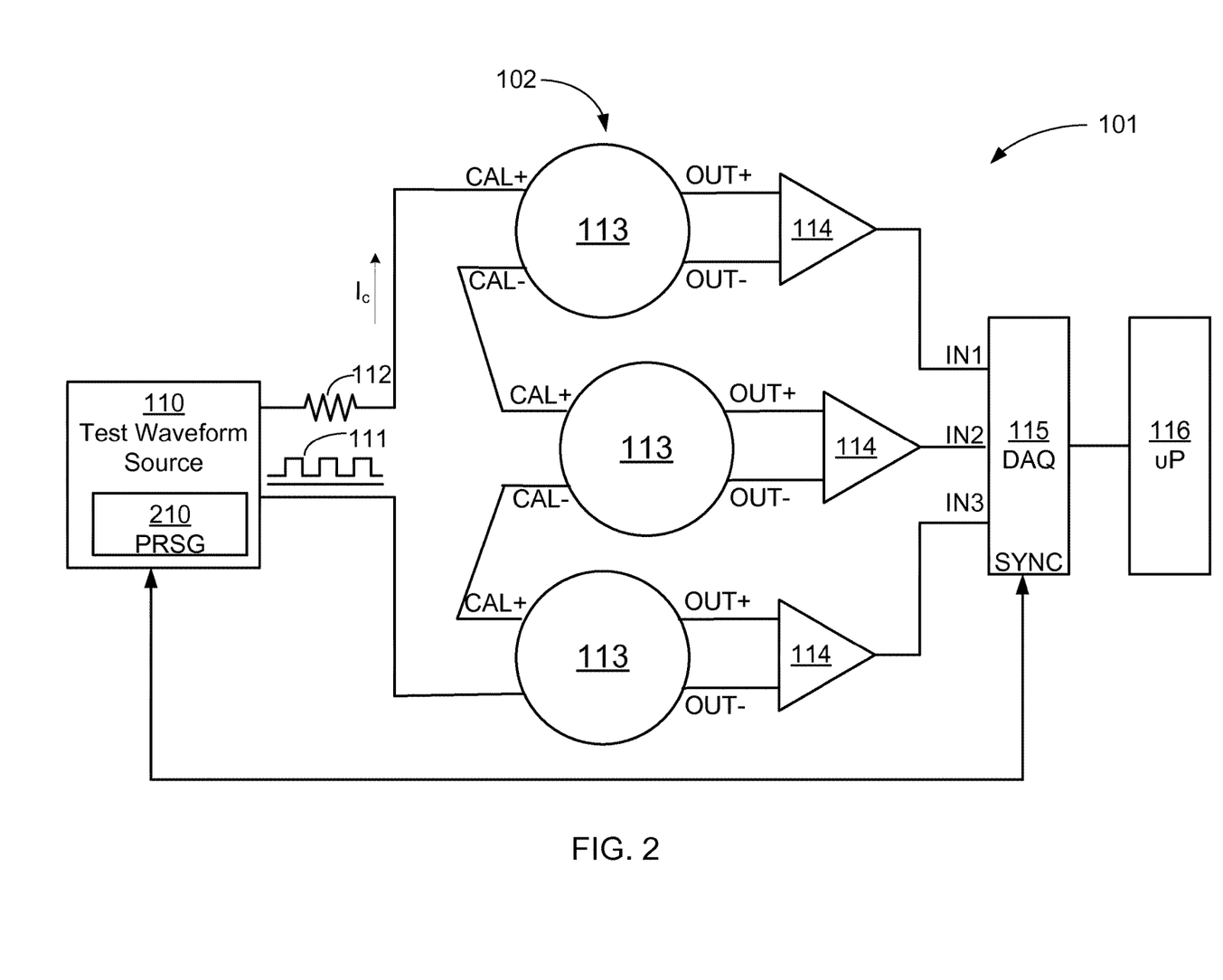
FIG. 2 is a block diagram of an electromagnetic receiver system with three sensors, including a calibration system.

Referring now to FIG. 2, in an example embodiment the sensor sensor assembly 102 is part of a calibrated EM receiver system 101. In the illustrated embodiment of FIG. 2, the sensor assembly 102 of electromagnetic receiver system 101 has three magnetic induction sensor assemblies 113, which may for example have mutually orthogonal sensitive axes. In alternative configurations the sensor assembly 102 can have only one sensor assembly 113, or more than three sensor assemblies 113. In addition to the sensor assembly 102, the electromagnetic receiver system 101 also includes a test waveform source 110, signal amplifiers 114 (each associated with a respective sensor assembly 113), a data acquisition (DAQ) system 115, and a data processing system 116 such as a computer. In at least some example embodiments, the test waveform source 110, data acquisition (DAQ) system 115 and data processing system 116 can be located in aircraft 28 and connected to the sensor assembly 102 by shielded communications links that run along tow cable 15 and support ropes 16. Amplifiers 114 may be located physically near or at the sensor assembly 102 to mitigate against the introduction of pre-amplifier noise to signals acquired by the receiver sensor assemblies 113. In some example embodiments, data may be acquired and stored at data acquisition system 115 for transmission or transfer to a processing system 116 that is remote from the aircraft 28.

Figure 3:
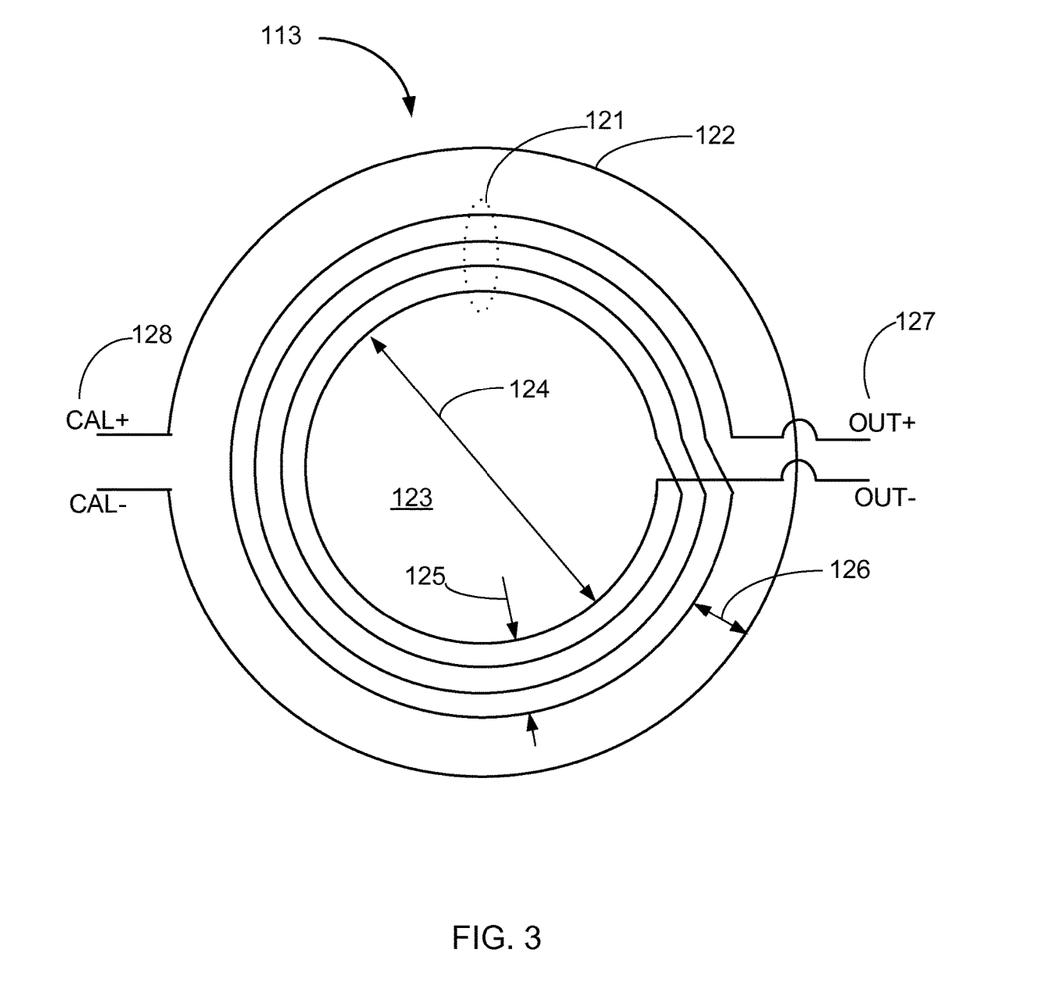
FIG. 3 is a schematic plan view of an air core magnetic induction sensor with calibration loop which can be used in the receiver system of FIG. 2 according to an example embodiment of the invention.

Referring to FIG. 3, each sensor assembly 113 includes a calibration loop 122 having calibration terminals 128 (CAL+, CAL−), and a loop or main winding in the form of a magnetic induction sensor 121 that has output terminals 127 (OUT+, OUT−). Example embodiments of sensor assemblies 113 will be described in greater detail below.

Referring to FIGS. 2 and 3, in a normal operation mode of the receiver system 101 during a geological survey flight of the TDEM system 100, the test waveform source 110 is disabled. The magnetic induction sensor 121 of each magnetic induction sensor assembly 113 senses the rate of change of the magnetic field dB/dt parallel to its sensitive axis, producing a time varying voltage signal in proportion to dB/dt between its output terminals OUT+ and OUT−. Each such signal is processed by the amplifier 114 associated with each magnetic induction sensor assembly 113, then converted to a digital time series and recorded by data acquisition system (DAQ) 115. In a multiple sensor system, the digital time series from all the inputs IN1, IN2 and IN3 of the data acquisition system 115 are recorded synchronously with each other. In some embodiments, the amplifiers 114 may be omitted. In some of the example embodiments, one sensor assembly 113 may be configured to sense the rate of change of current dI/dt in the transmitter loop 104 instead of the magnetic field dB/dt.

Thus, in normal operating mode the sensor assemblies 113 sense the secondary response of the earth and the resulting data is recorded by the data acquisition system 115. In an example embodiment, in addition to a normal operating mode, the receiver system 101 is configured to also be able to function in a calibration mode. The calibration mode may for example be performed on the ground during set up of the survey system 100 at the location of a geophysical survey and the resulting calibration readings used for the entire survey data set. In some example embodiments, the calibration mode may be performed at periodic times, for example every week or every morning. In some embodiments, calibration mode may be initiated during flight by an operator at the start of a survey flight or periodically throughout a survey flight. In some example embodiments, the calibration mode may be as part of a dedicated calibration flight or as part of a flight that includes both a calibration period and a normal operating period. Alternatively, the calibration mode may be automatically activated by DAQ 115 or processing system 116 at the start of a survey flight or periodically during the survey upon the occurrence of predetermined events such as one or more of the expiry of a time period or a threshold change in one or more sensed environmental conditions such as temperature, pressure and condensation.

In calibration mode, the test waveform source 110 generates a known voltage waveform 111 which contains components at multiple frequencies. In some embodiments, for example, the waveform 111 is a square wave with an on/off ratio of 1, which contains components at all the odd harmonics of its fundamental frequency. In some embodiments, the test waveform 111 may be derived from a pseudo random sequence generator (PRSG) 210. In the illustrated embodiment, a sync signal is provided between the DAQ 115 and the test waveform source 110 so that the waveform 111 is synchronized with the DAQ 115 enabling the phase relation of the sensor signals recorded by the DAQ 115 and the test signal waveform 111 to be determined. In some embodiments, the synchronizing signal is derived from an external source such as a GPS receiver and input to both the test waveform source 110 and the DAQ 115. In some embodiments, the test waveform 111 is input directly to an additional input of the DAQ 115 to enable the phase relation to be determined.

In calibration mode, the known voltage waveform 111 is converted to a known current waveform $I_c$ by a resistor 112. The resistor value is chosen so that it is much greater than the inductive reactance of the calibration loop at the highest frequency for which calibration results are required. The known current waveform $I_c$ current passes through the calibration loops 122 (FIG. 3) of each of the magnetic induction sensor assemblies 113, which are connected in series in the illustrated embodiment. Each calibration loop 122 produces a time varying magnetic field in proportion to the current waveform $I_c$. The magnetic fields in turn produce signals at the output terminals OUT+, OUT− of each sensor assembly 113. The signals are processed by amplifiers 114 and recorded by the DAQ 115. The recorded waveforms are processed by computer 116 to determine the combined response of each sensor assembly 113, its associated amplifier 114 and its associated channel of the DAQ 115. This processing is performed using either time domain or frequency domain techniques in different embodiments. Other embodiments may use a different kind or configuration for providing calibration current waveform $I_c$. Some embodiments have a separate current source for each sensor assembly 113, for example.

Each sensor assembly 113, each amplifier 114 and each channel IN1, IN2 and IN3 of the DAQ 115 forms a unique sensor system channel having a response which varies with frequency. By operating in the calibration mode as described, the combined response of each sensor channel of the complete system can be determined by the computer 116. Subsequently, when signals are acquired in the normal operating mode, the response for each sensor channel as determined in the calibration mode is used by computer 116 to remove the effect of the sensor assembly 113, amplifier 114, and DAQ from the signal for that specific sensor channel, as will be described in greater detail below. This allows the response of the earth to be determined more accurately.

Referring again to FIG. 3, an example embodiment of an air coil magnetic induction sensor assembly 113 of the receiver assembly 102 will now be explained in greater detail. The sensor assembly 113 includes an air coil magnetic induction sensor 121 that is formed by a main winding comprised of multiple turns of insulated electrical wire around a central area 123. Although FIG. 3 shows four representative circular turns in the main winding of the air core sensor 121, some practical embodiments have, for example, 100-200 turns with a common sensitive axis, with the diameter 124 of each turn being 1 m to 8 m. The sensor 121 can be non-circular—for example, in some embodiments the turns are polygonal or elliptical.

As will be appreciated by those skilled in the art, the sensitivity and phase shift of the output of a winding of a sensor loop relative to the ambient magnetic field dB/dt can be determined by calibrating the winding in a homogeneous magnetic field with a precisely known amplitude and waveform. However, this requires a calibration winding that is large compared to the winding being calibrated, which is difficult to arrange in many field situations At low frequencies, the response of the winding of the sensor 121 to a magnetic field is Ae dB/dt, where Ae is the "effective area" of the sensor 121, which is the sum of the areas enclosed by all the turns of the winding, projected on a plane perpendicular to the direction of the magnetic field vector. Thus the sensitivity of the winding can be accurately calculated from the dimensions and number of turns of the winding without the need for electrical measurements. At low frequencies, the sensitivity of the winding is the effective area Ae, and there is no phase shift between the dB/dt and the output of the winding of sensor 121. This technique is accurate for signal frequencies that are much less than the self-resonant frequency of the winding and the bandwidth of the amplifier 114 and the DAQ 115. Also the signal frequency must be such that input impedance of the amplifier 114 is much greater than the impedance of the winding.

In order to determine the sensitivity at high frequencies of the winding of the sensor 121 and its associated amplifier 114 and DAQ 115, the winding can be placed in a homogeneous magnetic field of known amplitude and waveform. Such a field could be generated for example by a calibration winding in the form of a "Helmholtz coil" with a diameter and length substantially larger than the winding under test, or by a loop with a diameter or width several times larger than the winding under test. As noted above, such a configuration can be impractical and accordingly example embodiments are described herein in which a calibration loop that is comparable in size to the sensor loop can be employed.

In this regard, FIG. 3 shows a calibration loop 122 which is comparable in size to the main winding of the sensor 121. Due to its relatively small size, the calibration loop 122 does not generate a homogeneous magnetic field in the volume occupied by the main winding of the sensor 121. The field that calibration loop 122 generates at any point will vary substantially with small changes in the loop dimensions or configuration, and so cannot be used to accurately measure the sensitivity of the main winding of the sensor 121. However, the instantaneous magnetic field generated by the calibration loop 122 at any point depends only on the current in the loop 122, independent of frequency. Therefore the relative amplitude and phase shift of the sensor loop main winding response measured in the frequency domain, as a ratio relative to its response at a selected low frequency, can be determined using the response to a known current $I_c$ applied to the calibration loop 122. Furthermore, that ratio and phase shift are substantially independent of the configuration or dimensions of the calibration loop winding, so long as all turns of the main winding of the sensor 121 are subject to substantially the same field.

In example embodiments, the calibration loop 122 is typically one turn or a very small number of turns. One reason for using a single turn or very small number of turns is to minimize the inductance of the calibration winding so that the current waveform is a replica of the voltage waveform applied through resistor 112 (i.e. it is substantially determined by the resistance of that resistor, and the effect of inductance is negligible). In embodiments where the calibration winding has only one (or very few) turns, the magnetic field it generates may be weak, so that ambient magnetic noise from cultural or natural sources may affect the waveforms recorded during calibration. This can be mitigated by acquiring data for many cycles of the calibration waveform and "stacking" (averaging) the recorded waveform in the DAC 115 or computer 116.

In some applications, the accuracy of the above-mentioned ratio may be compromised if the calibration loop 122 is close enough to the main winding of the sensor 121 that there are significant differences between the flux passing through different turns of the main winding. Accordingly, in some applications, accuracy may be improved if a separation distance 126 is provided between the main winding of the sensor 121 and the calibration loop 122 that is greater than the width 125 of the bundle of wires comprising the turns of the main winding of the sensor 121.

Similarly, when measured in the time domain, the voltage waveform in the main winding of the sensor loop 121 generated by a current waveform $I_c$ in the winding of calibration loop 122 will differ only by an amplitude ratio from the waveform that would be generated by a large calibration winding producing a homogeneous field such as in the Hemholtz coil example discussed above.

Figure 4:
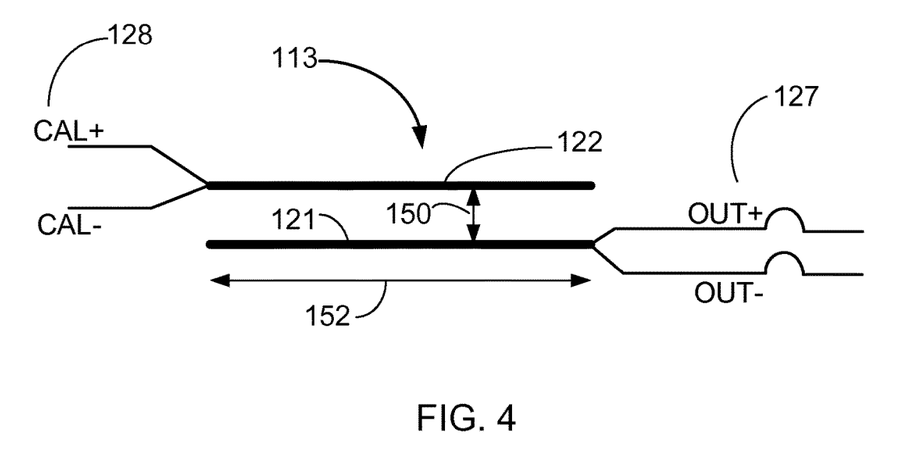
FIG. 4 is a schematic side view of an air core magnetic induction sensor with calibration loop, according to a further example embodiment of the invention.
Figure 5:
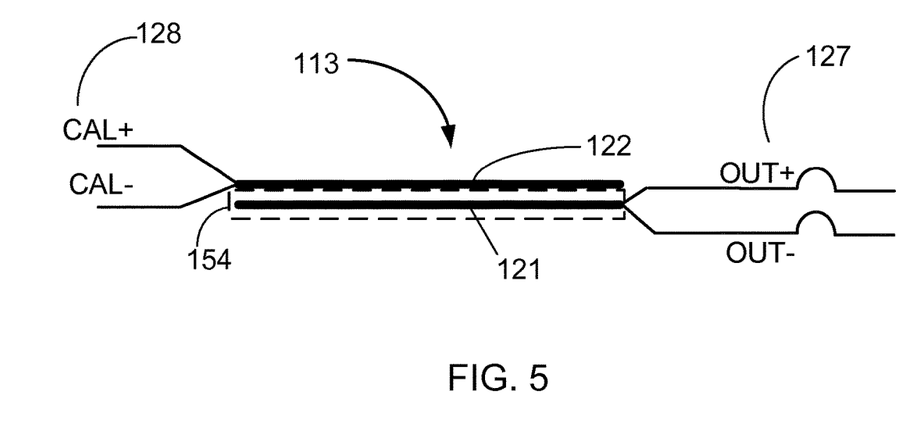
FIG. 5 is a schematic side view of an air core magnetic induction sensor with calibration loop, according to a further example embodiment of the invention.

In FIG. 3, the calibration loop 122 is schematically illustrated as lying in the same plane the sensor 121, with a larger diameter than the sensor 121 such that the calibration loop 122 is separated by a radial distance 126 from the sensor 121. FIG. 4 illustrates an alternative embodiment of a receiver sensor which is identical to the receiver sensor assembly 113 of FIG. 3 with the exception that the calibration loop 122 is of substantially the same diameter 152 as the main winding of the sensor 121, lying in a plane perpendicular to the axis of the main winding but separated axial distance 150 from the main winding. In some embodiments such as illustrated in FIG. 5 the calibration loop 122 is temporarily attached during calibration mode to the exterior of a shell 154 that contains the main winding of sensor 121, so that the calibration loop 122 runs roughly parallel to the turns of the main winding of the sensor 121.

It will thus be appreciated that since the response of the main winding of the sensor 121 at low frequencies can be calculated from its dimensions, and the amplitude ratio and phase shift at high frequencies relative to the response at low frequencies can be measured using a small calibration loop 122, the channel response at over the useful frequency range of each sensor assembly 113 can be determined by combining the two types of calibration, without need for a large calibration winding. Accordingly, in example embodiments, in calibration mode the computer 116 is configured to determine the channel response for each sensor channel for higher frequencies, then combine those results with the known low frequency sensitivity for each sensor channel to obtain a sensor channel specific calibration factor that includes one or both of the transfer function and impulse response over the useful frequency range of each sensor assembly 113. In particular, in some embodiments, the complex Fourier transform of the response to the calibration waveform in each channel is first calculated, for example using known FFT algorithms; it is then divided by the complex Fourier transform of the calibration current waveform 111; the resulting function is divided by the magnitude of that function at a selected low frequency (for example, the fundamental frequency of the calibration waveform); and the resulting function in turn is multiplied by the known effective area Ae of the sensor; yielding a complex transfer function relating the signal recorded in each channel in units of voltage to the rate of change of magnetic field dB/dt; the inverse Fourier transform of each transfer function is then calculated to obtain the impulse response. Data that is recorded during normal operating mode of the receiver system 101 is then corrected using the transfer function and impulse response determined as the calibration factor for its associated sensor channel during the calibration mode. As a result, calibration loop 122 does not need to be substantially larger in size relative to the sensor 121, and can be comparable in size to the sensor.

Although magnetic induction sensors 121 in the receiver assembly 102 have has been described above as air coil sensors, in some example embodiments one or more of the magnetic induction sensors 121 could be implemented using ferromagnetic cored sensors such that the receiver assembly 102 includes all ferromagnetic cored sensors or a mixture of air and ferromagnetic sensors. It will be appreciated by those skilled in the art that other types of sensors, such as ferromagnetic cored sensors, may have a stable response at low frequencies such that an effective area Ae can be measured at less frequent intervals using an apparatus such as a Helmholtz coil or solenoid calibration tube, and combined with more frequent measurements of the response over a wide frequency range using a calibration loop, as described above.

Figure 6:
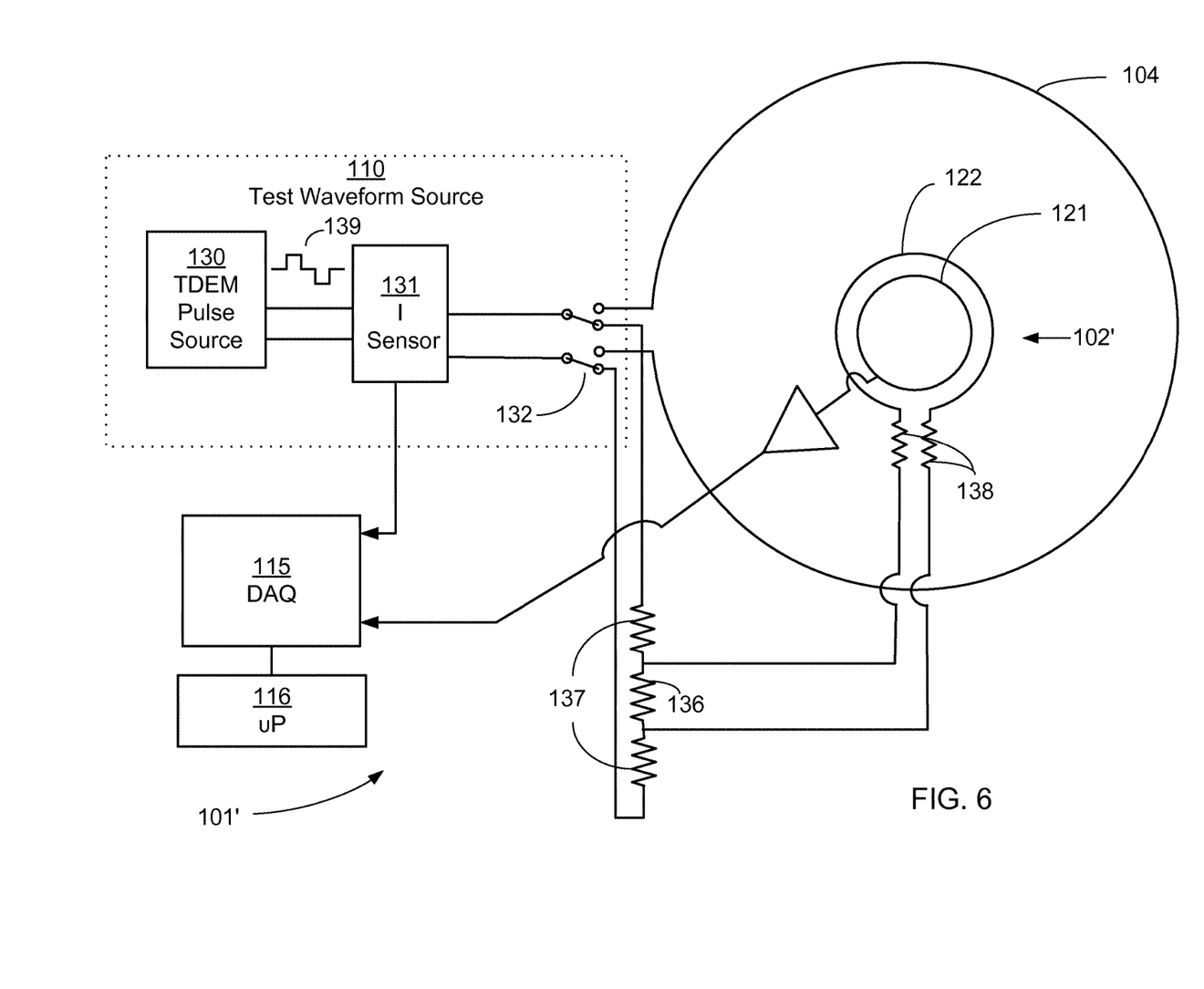
FIG. 6 is a schematic view of a further example of a TDEM system including a system to calibrate the transmitter current sensor and the receiver coils with the same current waveform.

FIG. 6 illustrates another example embodiment of a calibrated EM receiver system 101' that includes a three-axis sensor assembly 102' (only a single receiver loop 121 of the three sensor loop assembly is shown in FIG. 6). EM receiver system 101' can be used in the TDEM survey system 100 and is similar to system 101 except for differences that will be apparent from the Figures and the following description. TDEM survey system 100 includes transmitter loop 104 to transmit a primary magnetic waveform and a TDEM pulse source 130 to generate the waveform. In EM receiver system 101', the TDEM pulse source 130 is also used to implement the test waveform source 110 used in calibration mode.

In particular, in normal operation mode, the output of TDEM pulse source 130 passes through a current sensor 131. The transmitter current waveform 139 is recorded by the DAQ 115 and is coupled to the transmitter loop 104 (shown schematically here as a single turn, though some embodiments use multiple turns) through a switch or connector 132. The response, including the secondary earth response, is detected by the sensor 121 and recorded by the DAQ 140.

In calibration mode, switch of connector 132 is operated to replace the transmitter loop by a resistive load (136, 137). The same current waveform 139 that passes through the current sensor 131 also passes through the resistive load. Resistor 136 is smaller in value than resistors 137, so that the voltage waveform across resistor 136 is a scaled down replica of the current through the current sensor 131. This waveform is replicated as a low amplitude current waveform by resistors 138 (which perform the same function as resistor 112 in FIG. 2) which passes through the calibration loop 122. In this example embodiment, the three-axis sensor assembly 102' includes a single external calibration loop 122 is positioned roughly around the sensor loops 121 in an orientation that generates a magnetic field in a direction that affects all three sensor loops 121. In other embodiments, a serially connected calibration loop is incorporated internally in the sensor assembly 102' for each receiver loop 121.

In the embodiment of FIG. 6, the current waveform 139 delivered to the calibration loop 122 is a replica of the current waveform that passes through the current transformer 131. (Resistor 136 can be selected to minimize the effect of parasitic capacitance in the cable between resistor 136 and resistors 138.) Therefore, any departure of the current waveform from the ideal or desired calibration waveform affects both the current sensor channel calibration and the receiver sensor calibration. The earth response is derived from the transfer function between the waveform in the transmitter current channel and each receiver channel. Errors that appear in the calibration of both channels will cancel each other when this transfer function is calculated.

Although the receiver system 101 of FIGS. 2 and 3 has been described above in the context of an active source EM system, the receiver system 101 of FIGS. 2 and 3 could alternatively be applied to a passive source geological surveying system including for example the systems described in the above-identified patents and patent applications. Furthermore, the receiver systems 101 and 101' could be used in non-airborne geological surveying applications, and as noted above, could have as few as one sensor loop and more than three sensor loops.

The particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within scope of the description so that those skilled in the art should understand that they can make various changes, substitutions and alterations without departing from the scope of the appended claims. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

What is claimed is:

1. An electromagnetic receiver system for geophysical surveying comprising:
    a magnetic induction sensor for generating signals representative of changes in a sensed magnetic field;
    a waveform source for generating a test waveform having a first frequency range;
    a calibration loop positioned at least temporarily proximate to the magnetic induction sensor to generate a calibration response signal in the magnetic induction sensor upon application of the test waveform to the calibration loop; and
    a processing system configured to determine a calibration factor for application to signals from the magnetic induction sensor, the processing system determining the calibration factor in dependence on both the calibration response signal and a known sensitivity for the magnetic induction sensor for a second frequency range that is lower than the first frequency range.

2. The system of claim 1 wherein the calibration factor includes a transfer function in frequency domain and an impulse response in the time domain.

3. The system of claim 2 wherein the transfer function and impulse response are obtained over a frequency range of the magnetic induction sensor that corresponds to data obtained from geological surveying.

4. The system of claim 1 wherein the calibration loop is substantially similar in size to the magnetic induction sensor.

5. The system of claim 1 wherein the processing system is configured to apply the calibration factor to signals received from the magnetic induction sensor during a geological survey.

6. The system of claim 1 in which the waveform source generates a pseudo random square wave current waveform.

7. The system of claim 1 including:
    a transmitter loop for generating a primary electromagnetic field in response to a driving signal applied thereto, wherein the waveform source is adapted to selectively apply the driving signal to the transmitter loop and the test waveform to the calibration loop;
    a current sensor configured to measure current generated by the waveform source, the processing system being responsive to the current sensor.

8. The system of claim 1 wherein the receiver system is incorporated into a tow assembly for an airborne time domain electromagnetic (TDEM) survey system or a tow assembly for an airborne passive source survey system.

9. The system of claim 1 comprising a plurality of magnetic induction sensors for generating signals representative of changes in a magnetic field, the processing system configured to determine a unique calibration factor for application to signals from each of the magnetic induction sensors.

10. The system of claim 1 wherein the magnetic induction sensor is an air coil sensor loop and the known sensitivity for the sensor loop for the second frequency range is determined based on physical dimensions of the air coil sensor loop.

11. A method for calibrating an electromagnetic receiver system for geophysical surveying, wherein the receiver system includes a magnetic induction sensor for generating signals representative of changes in a sensed magnetic field, a waveform source for generating a test waveform, and a calibration loop positioned at least temporarily proximate to the magnetic induction sensor, the method comprising:

- measuring a calibration response from the magnetic induction sensor to a test waveform having a first frequency range that is applied to the calibration loop by the waveform source; and
- determining a calibration factor for application to survey signals from the magnetic induction sensor, the calibration factor being determined in dependence on both the calibration response and a known sensitivity for the magnetic induction sensor for a second frequency range that is lower than the first frequency range.

12. The method of claim 11 wherein determining the calibration factor comprises:
  (a) calculating a complex Fourier transform of the calibration response;
  (b) dividing the complex Fourier transform of the calibration response by the complex Fourier transform of the test waveform to obtain a first function;
  (c) determining a magnitude of the first function at a selected low frequency;
  (d) dividing the first function by the determined magnitude to obtain a second function;
  (e) multiplying the second function by an effective area Ae of the magnetic induction sensor yielding a complex transfer function relating the calibration response to the rate of change of magnetic field dB/dt; and
  (f) calculating an inverse Fourier transform for the complex transfer function to obtain an impulse response.

13. The method 12 wherein the complex transfer function and the impulse response are obtained over a frequency range of the magnetic induction sensor that corresponds to data obtained from geological surveying.

14. The method of claim 11 further comprising applying the calibration factor to survey signals received from the magnetic induction sensor during a geological survey.

15. The method of claim 11 wherein the test waveform is a square wave current waveform.

16. The method of claim 11 wherein the electromagnetic receiver system includes a transmitter loop for generating a primary electromagnetic field in response to a driving signal applied thereto and a current sensor configured to measure current generated by the waveform source, wherein the waveform source selectively applies the driving signal to the transmitter loop and the test waveform to the calibration loop, wherein the calibration factor is determined in dependence on measured current information from the current sensor.

17. The method of claim 11 wherein the receiver system is incorporated into a tow assembly for an airborne time domain electromagnetic (TDEM) survey system or a tow assembly for an airborne passive source survey system.

18. An electromagnetic receiver system for geophysical surveying including:
  a magnetic induction sensor having known low frequency sensitivity,
  a test current waveform generator,
  a calibration loop comparable in size to the sensor, and
  a processing system for combining measurements taken by the sensor when a test waveform is applied to the calibration loop with the known low frequency sensitivity of the sensor to obtain a transfer function and impulse response over a useful operating frequency range of the sensor.

19. The electromagnetic receiver system for of claim 18 wherein the processing system is configured to apply at least one of the transfer function and impulse response to survey measurements obtained from the magnetic induction sensor during a geological survey.

20. The system of claim 18 wherein the sensor comprises multiple turns of electrical wire that form a bundle of wires around a central area, and the calibration loop extends around the sensor and is separated from the sensor by a distance that is greater than a width of a cross-sectional area of the bundle of wires.

21. The system of claim 18 wherein the sensor comprises multiple turns of electrical wire, the calibration loop having substantially a same diameter as the sensor and lying in a plane perpendicular to an axis of the sensor and separated and axial distance from the sensor.

22. A method for calibrating an electromagnetic receiver system for geophysical surveying including at least one induction magnetic sensor that comprises multiple turns of insulated electrical wire around a central area, to obtain a system transfer function in the frequency domain and a system impulse response in the time domain, comprising:
  determining a low frequency response of the sensor by calculating an effective area of the sensor based on the central area enclosed by all turns of the electrical wire of the sensor,
  generating a known current waveform having frequency components spanning a useful operating frequency range of the sensor,
  passing the current waveform through at least one calibration loop that is comparable in size to the sensor and positioned to generate a magnetic field in the sensor,
  recording resulting signals generated by the sensor,
  analyzing the recorded signals to determine at multiple frequencies, the ratio of a sensor response at that frequency to the low frequency response,
  combining the ratio with a known low frequency sensitivity of the sensor to obtain the system transfer function and system impulse response over the useful operating frequency range of the sensor.

* * * * *